US012765249B2

(12) United States Patent
Aochi et al.

(10) Patent No.: US 12,765,249 B2
(45) Date of Patent: Oct. 13, 2026

(54) ORGANIC VAPOR JET PRINTING SYSTEM

(71) Applicant: Universal Display Corporation, Ewing, NJ (US)

(72) Inventors: Steven Shigeki Aochi, San Jose, CA (US); Vadim Boguslavskiy, Princeton, NJ (US); Evan Hernandez, San Jose, CA (US); Kent Khuong Nguyen, San Jose, CA (US); Michael Filippi, Hayward, CA (US); Matthew King, Moorestown, NJ (US); Daniel Toet, Monte Sereno, CA (US)

(73) Assignee: Universal Display Corporation, Ewing, NJ (US)

(*) Notice: Subject to any disclaimer, the term of this patent is extended or adjusted under 35 U.S.C. 154(b) by 532 days.

(21) Appl. No.: 18/311,550

(22) Filed: May 3, 2023

(65) Prior Publication Data

US 2023/0363244 A1 Nov. 9, 2023

Related U.S. Application Data

(60) Provisional application No. 63/339,839, filed on May 9, 2022.

(51) Int. Cl.
*H10K 71/13* (2023.01)
*H10K 71/20* (2023.01)
(Continued)

(52) U.S. Cl.
CPC ........... *H10K 71/13* (2023.02); *H10K 71/221* (2023.02); *H10K 71/40* (2023.02); *H10K 85/324* (2023.02); *H10K 85/341* (2023.02)

(58) Field of Classification Search
CPC .... H10K 85/341; H10K 85/324; H10K 71/13; H10K 71/40; H10K 71/221; H01J 2237/332–3348
(Continued)

(56) References Cited

U.S. PATENT DOCUMENTS 4,769,292 A 9/1988 Tang
5,247,190 A 9/1993 Friend
(Continued)

FOREIGN PATENT DOCUMENTS

EP 2411556 B1 11/2018
EP 2473646 B1 12/2018
(Continued)

OTHER PUBLICATIONS

Extended European Search Report issued in App. No. EP23172365, dated Oct. 9, 2023, 6 pages.
(Continued)

*Primary Examiner* — Charlee J. C. Bennett
(74) *Attorney, Agent, or Firm* — Butzel Long

(57) ABSTRACT

An organic vapor jet printing (OVJP) device is provided that includes an OVJP print die having one or more delivery channels to deliver organic material and carrier gas to a region below the print die and one or more exhaust channels to remove material from below the print die. A directly-heated delivery line connected to the one or more delivery channels and a source of the organic material external to the OVJP print die includes a resistive material and a plurality of electrical connections to the resistive material. When a current is applied to the resistive material via the plurality of electrical connections, the resistive material heats the interior of the directly-heated delivery line.

18 Claims, 5 Drawing Sheets

(51) Int. Cl.
*H10K 71/40* (2023.01)
*H10K 85/30* (2023.01)

(58) Field of Classification Search
USPC .................. 118/715–733; 156/345.1–345.55
See application file for complete search history.

(56) References Cited

U.S. PATENT DOCUMENTS

| | | | | |
|---|---|---|---|---|
| 5,703,436 | A | 12/1997 | Forrest | |
| 5,707,745 | A | 1/1998 | Forrest | |
| 5,834,893 | A | 11/1998 | Bulovic | |
| 5,844,363 | A | 12/1998 | Gu | |
| 6,013,982 | A | 1/2000 | Thompson | |
| 6,087,196 | A | 7/2000 | Sturm | |
| 6,091,195 | A | 7/2000 | Forrest | |
| 6,097,147 | A | 8/2000 | Baldo | |
| 6,294,398 | B1 | 9/2001 | Kim | |
| 6,303,238 | B1 | 10/2001 | Thompson | |
| 6,337,102 | B1 | 1/2002 | Forrest | |
| 6,468,819 | B1 | 10/2002 | Kim | |
| 6,537,688 | B2 | 3/2003 | Silvernail | |
| 6,597,111 | B2 | 7/2003 | Silvernail | |
| 6,664,137 | B2 | 12/2003 | Weaver | |
| 6,835,950 | B2 | 12/2004 | Brown | |
| 6,888,305 | B2 | 5/2005 | Weaver | |
| 6,888,307 | B2 | 5/2005 | Silvernail | |
| 6,897,474 | B2 | 5/2005 | Brown | |
| 7,187,119 | B2 | 3/2007 | Weaver | |
| 7,279,704 | B2 | 10/2007 | Walters | |
| 7,431,968 | B1 * | 10/2008 | Shtein | C23C 14/228 427/255.6 |
| 7,683,534 | B2 | 3/2010 | Weaver | |
| 7,968,146 | B2 | 6/2011 | Wagner | |
| 2003/0230980 | A1 | 12/2003 | Forrest | |
| 2004/0174116 | A1 | 9/2004 | Lu | |
| 2010/0248416 | A1 * | 9/2010 | Priddy | C23C 14/0623 438/57 |
| 2011/0097495 | A1 * | 4/2011 | Burrows | C23C 14/564 239/128 |
| 2016/0083845 | A1 | 3/2016 | Quinn | |
| 2017/0117166 | A1 * | 4/2017 | Ragunathan | H01L 21/6836 |
| 2017/0229663 | A1 | 8/2017 | Tsai | |
| 2019/0386216 | A1 * | 12/2019 | Quinn | H10K 71/13 |
| 2019/0386256 | A1 | 12/2019 | Quinn | |
| 2020/0251655 | A1 * | 8/2020 | McGraw | H10K 71/13 |
| 2021/0040611 | A1 * | 2/2021 | Shanbhag | C23C 16/45561 |

FOREIGN PATENT DOCUMENTS

| | | | |
|---|---|---|---|
| KR | 20120058591 | | 6/2012 |
| WO | 2008057394 | A1 | 5/2008 |
| WO | 2010011390 | A2 | 1/2010 |

OTHER PUBLICATIONS

Baldo et al. "Highly efficient phosphorescent emission from organic electroluminescent devices", Nature, vol. 395, pp. 151-154, 1998.
Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.
Korean Office Action (including English translation) issued in App. No. KR20230059355, dated May 2, 2026 (pp. 1-9).

* cited by examiner

ORGANIC VAPOR JET PRINTING SYSTEM

CROSS-REFERENCE TO RELATED APPLICATIONS

This application claims the priority benefit of U.S. Provisional Patent Application Ser. No. 63/339,839, filed May 9, 2022, the entire contents of which are incorporated herein by reference.

FIELD

The present invention relates to devices and techniques for fabricating organic emissive devices, such as organic light emitting diodes, and devices and techniques including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

Layers, materials, regions, and devices may be described herein in reference to the color of light they emit. In general, as used herein, an emissive region that is described as producing a specific color of light may include one or more emissive layers disposed over each other in a stack.

As used herein, a "red" layer, material, region, or device refers to one that emits light in the range of about 580-700 nm or having a highest peak in its emission spectrum in that region. Similarly, a "green" layer, material, region, or device refers to one that emits or has an emission spectrum with a peak wavelength in the range of about 500-600 nm; a "blue" layer, material, or device refers to one that emits or has an emission spectrum with a peak wavelength in the range of about 400-500 nm; and a "yellow" layer, material, region, or device refers to one that has an emission spectrum with a peak wavelength in the range of about 540-600 nm. In some arrangements, separate regions, layers, materials, regions, or devices may provide separate "deep blue" and a "light blue" light. As used herein, in arrangements that provide separate "light blue" and "deep blue", the "deep blue" component refers to one having a peak emission wavelength that is at least about 4 nm less than the peak emission wavelength of the "light blue" component. Typically, a "light blue" component has a peak emission wavelength in the range of about 465-500 nm, and a "deep blue" component has a peak emission wavelength in the range of about 400-470 nm, though these ranges may vary for some configurations. Similarly, a color altering layer refers to a layer that converts or modifies another color of light to light having a wavelength as specified for that color. For example, a "red" color filter refers to a filter that results in light having a wavelength in the range of about 580-700 nm. In general, there are two classes of color altering layers: color filters that modify a spectrum by removing unwanted wavelengths of light, and color changing layers that convert photons of higher energy to lower energy. A component "of a color" refers to a component that, when activated or used, produces or otherwise emits light having a particular color as previously described. For example, a "first emissive region of a first color" and a "second emissive region of a second color different than the first color" describes two emissive regions that, when activated within a device, emit two different colors as previously described.

As used herein, emissive materials, layers, and regions may be distinguished from one another and from other structures based upon light initially generated by the material, layer or region, as opposed to light eventually emitted by the same or a different structure. The initial light generation typically is the result of an energy level change resulting in emission of a photon. For example, an organic emissive material may initially generate blue light, which may be converted by a color filter, quantum dot or other structure to red or green light, such that a complete emissive stack or sub-pixel emits the red or green light. In this case the initial emissive material or layer may be referred to as a "blue" component, even though the sub-pixel is a "red" or "green" component.

In some cases, it may be preferable to describe the color of a component such as an emissive region, sub-pixel, color altering layer, or the like, in terms of 1931 CIE coordinates. For example, a yellow emissive material may have multiple peak emission wavelengths, one in or near an edge of the "green" region, and one within or near an edge of the "red" region as previously described. Accordingly, as used herein, each color term also corresponds to a shape in the 1931 CIE coordinate color space. The shape in 1931 CIE color space is constructed by following the locus between two color points and any additional interior points. For example, interior shape parameters for red, green, blue, and yellow may be defined as shown below:

| Color | CIE Shape Parameters |
|---|---|
| Central Red | Locus: [0.6270, 0.3725]; [0.7347, 0.2653]; Interior: [0.5086, 0.2657] |
| Central Green | Locus: [0.0326, 0.3530]; [0.3731, 0.6245]; Interior: [0.2268, 0.3321 |

-continued

| Color | CIE Shape Parameters |
|---|---|
| Central Blue | Locus: [0.1746, 0.0052]; [0.0326, 0.3530]; Interior: [0.2268, 0.3321] |
| Central Yellow | Locus: [0.373 1, 0.6245]; [0.6270, 0.3725]; Interior: [0.3 700, 0.4087]; [0.2886, 0.4572] |

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

An organic vapor jet printing (OVJP) device is provided that includes an OVJP print die comprising one or more delivery channels to deliver organic material and carrier gas to a region below the print die; and a directly-heated delivery line connected to the one or more delivery channels and configured to connect to a source of the organic material external to the OVJP print die, where the directly-heat delivery line includes a resistive material; and a plurality of electrical connections to the resistive material, where, when a current is applied to the resistive material via the plurality of electrical connections, the resistive material heats the interior of the directly-heated delivery line. The die may include one or more exhaust channels, for example disposed on one or both sides of each delivery channel.

The directly-heated delivery line may have a constant cross-section shape and area. It may be formed entirely or substantially entirely of the resistive material. An end of the directly-heated delivery line connected to the OVJP print die may be electrically insulated from the OVJP print die. The directly-heated delivery line may form a spiral, an S-shape, or an L-shape.

A heat shield may be disposed around the directly-heated delivery line. The heat shield may include a ceramic enclosure with sufficient clearance to allow for movement of the directly-heated delivery line when the OVJP device is moved between a maximum horizontal displacement and a minimum horizontal displacement. The heat shield may include a duct disposed around the directly-heated delivery line, the duct having a constant cross-section shape and area. An active cooler may be arranged and configured to cool at least a portion of the duct.

The OVJP device may include one or more temperature sensors; and a processor in signal communication with the one or more temperature sensors and configured to perform closed-loop control of a temperature within the directly-heated delivery line based upon a temperature signal provided by the one or more temperature sensors.

The OVJP device may include a directly-heated exhaust line connected to one or more exhaust channels in the die and configured to connect to an external source of vacuum, where the directly-heat exhaust line includes a resistive material; and a plurality of electrical connections to the resistive material, where, when a current is applied to the resistive material of the directly-heated exhaust line via the plurality of electrical connections of the directly-heated exhaust line, the resistive material of the directly-heated exhaust line heats the interior of the directly-heated exhaust line. The directly-heated exhaust line may be disposed within a heat shield duct having a constant cross-section shape and area. An active cooler may be arranged and configured to cool at least a portion of the duct around the exhaust line.

The OVJP device may include a manifold configured to distribute material from the flexible conduit to the one or more delivery channels, which may be formed from materials such as AlN, $Al_2O_3$, and $Si_3N_4$. The manifold may be formed from materials such as W, Mo, AlN, single-crystal Si, polycrystalline Si, columnar Si, or a combination thereof.

One or more temperature sensors may be attached to the manifold, and a processor in signal communication with the temperature sensors may be configured to perform closed-loop control of a temperature within the manifold and/or within the directly-heated delivery line.

OVJP print heads as disclosed may incorporate one or more print die(s) with nozzles that convey hot organic gas to and from the substrate. The print heads may include one or more print dies and/or manifold structures that distribute hot organic gas to the die and/or lead residue gas away from the die in uniform fashion. The print dies may be hermetically sealed to the manifold structures, such as by clamping/sealing, high temperature bonding (e.g., brazing, glass frit), or the like. The manifold may be formed from materials having thermal expansion coefficients close to that of the print die.

The OVJP print head may include heaters allowing for close control of gas temperature as it makes its way to and from the substrate. The heaters may be embedded in, attached to, or patterned onto the print head manifold, and may include different zones, each with a sensor for closed loop control.

The OVJP print head may include mechanisms allowing for controlled and/or symmetric expansion about its thermal center. It may include flexures, low friction surfaces, and the like.

The OVJP print head may include an active, closed-loop flight control mechanism, which may include sensors configured to measure the fly height between the print head and the substrate, and actuators controlling this gap on the left and right of the die.

The OVJP print head may hermetically interface with hot gas supply and exhaust lines. The gas lines may be attached to the OVJP print head by means of clamping/sealing, bonding to a flange, or the like. Flange materials may have thermal expansion coefficients close to that of print head and may accommodate vertical motion of print head.

The OVJP print head may include heat shields that protect the rest of the system from the high temperatures in the manifold and/or other components such as the organic material source(s), delivery lines, exhaust lines, and the like. Heat shields may include active cooled shields, thermally-insulating material, vacuum shields, and the like. The heat shields may include multiple segments, including front, back, sides, top, components specifically to protect the fly height sensors, components to protect the vertical motion actuators, and combinations thereof. A cold plate at the bottom of the print head may mitigate increases in substrate temperature and resulting deformations caused by the hot dies and gases.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
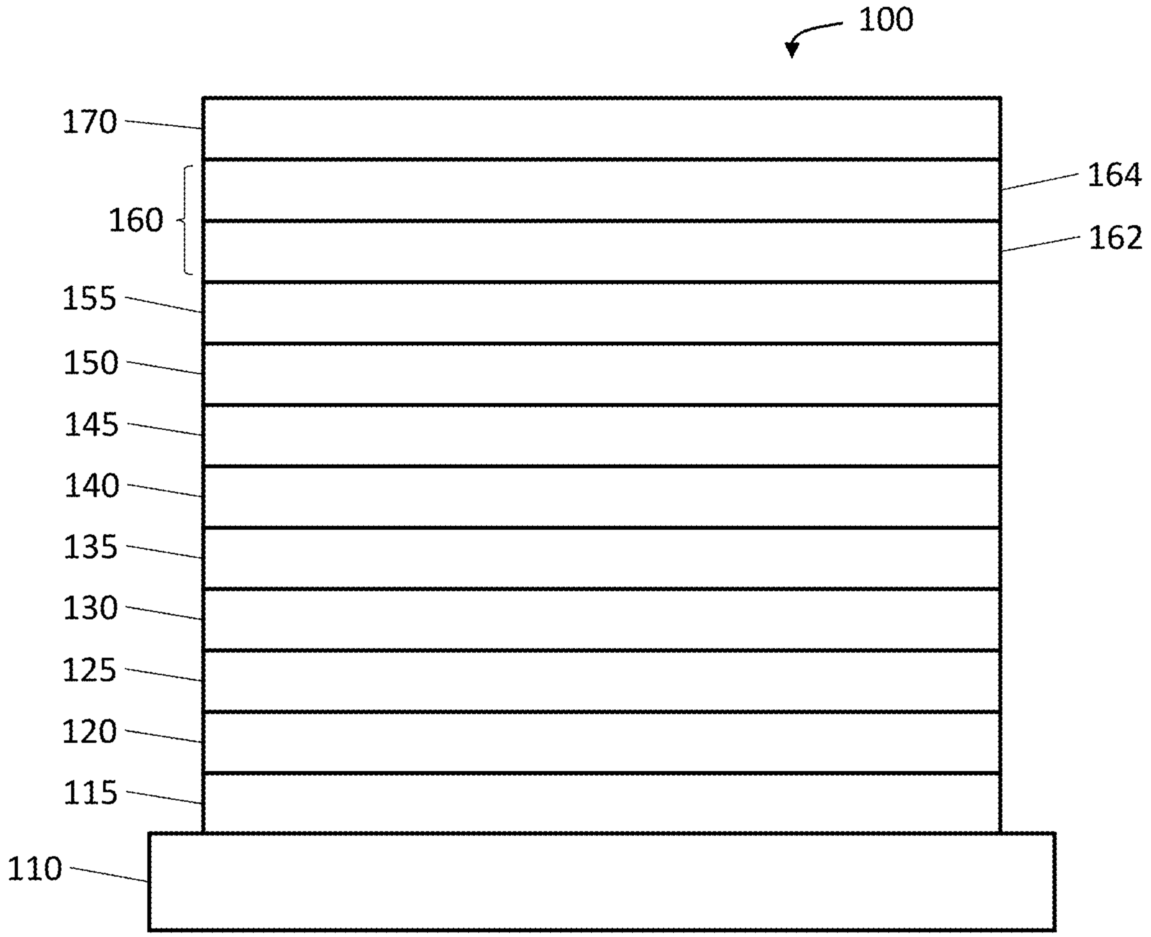
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. Barrier layer 170 may be a single- or multi-layer barrier and may cover or surround the other layers of the device. The barrier layer 170 may also surround the substrate 110, and/or it may be arranged between the substrate and the other layers of the device. The barrier also may be referred to as an encapsulant, encapsulation layer, protective layer, or permeation barrier, and typically provides protection against permeation by moisture, ambient air, and other similar materials through to the other layers of the device. Examples of barrier layer materials and structures are provided in U.S. Pat. Nos. 6,537,688, 6,597,111, 6,664,137, 6,835,950, 6,888,305, 6,888,307, 6,897,474, 7,187,119, and 7,683,534, each of which is incorporated by reference in its entirety.

Figure 2:
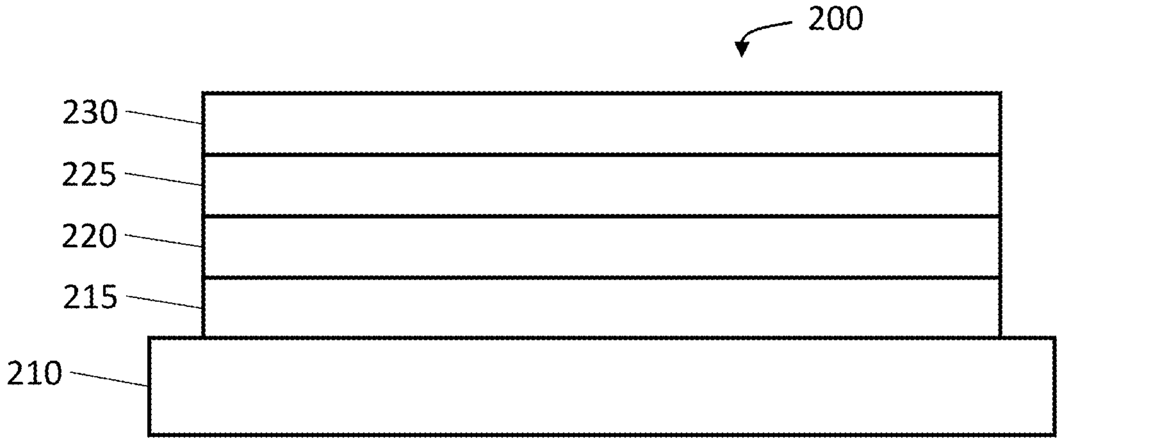
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. In general, an emissive layer includes emissive material within a host matrix. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light based on an injected electrical charge, where the initial light may be altered by another layer such as a color filter or other color altering layer that does not itself emit an initial light within the device, but may re-emit altered light of a different spectra content based upon absorption of the initial light emitted by the emissive layer and downconversion to a lower energy light emission. In some embodiments disclosed herein, the color altering layer, color filter, upconversion, and/or downconversion layer may be disposed outside of an OLED device, such as above or below an electrode of the OLED device.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a “mixture”, the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. The enhancement layer is provided no more than a threshold distance away from the organic emissive layer, wherein the emitter material has a total non-radiative decay rate constant and a total radiative decay rate constant due to the presence of the enhancement layer and the threshold distance is where the total non-radiative decay rate constant is equal to the total radiative decay rate constant. In some embodiments, the OLED further comprises an outcoupling layer. In some embodiments, the outcoupling layer is disposed over the enhancement layer on the opposite side of the organic emissive layer. In some embodiments, the outcoupling layer is disposed on opposite side of the emissive layer from the enhancement layer but still outcouples energy from the surface plasmon mode of the enhancement layer. The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. If energy is scattered to the non-free space mode of the OLED other outcoupling schemes could be incorporated to extract that energy to free space. In some embodiments, one or more intervening layer can be disposed between the enhancement layer and the outcoupling layer. The examples for interventing layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and reduced efficiency roll-off of the OLED device. Placement of the enhancement layer on the cathode side, anode side, or on both sides results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

The enhancement layer can be comprised of plasmonic materials, optically active metamaterials, or hyperbolic metamaterials. As used herein, a plasmonic material is a material in which the real part of the dielectric constant crosses zero in the visible or ultraviolet region of the electromagnetic spectrum. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, Ca alloys or mixtures of these materials, and stacks of these materials. In general, a metamaterial is a medium composed of different materials where the medium as a whole acts differently than the sum of its material parts. In particular, we define optically active metamaterials as materials which have both negative permittivity and negative permeability. Hyperbolic metamaterials, on the other hand, are anisotropic media in which the permittivity or permeability are of different sign for different spatial directions. Optically active metamaterials and hyperbolic metamaterials are strictly distinguished from many other photonic structures such as Distributed Bragg Reflectors (“DBRs”) in that the medium should appear uniform in the direction of propagation on the length scale of the wavelength of light. Using terminology that one skilled in the art can understand: the dielectric constant of the metamaterials in the direction of propagation can be described with the effective medium approximation. Plasmonic materials and metamaterials provide methods for controlling the propagation of light that can enhance OLED performance in a number of ways.

In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly. In some embodiments, the wavelength-sized features and the sub-wavelength-sized features have sharp edges.

In some embodiments, the outcoupling layer has wavelength-sized features that are arranged periodically, quasi-periodically, or randomly, or sub-wavelength-sized features that are arranged periodically, quasi-periodically, or randomly. In some embodiments, the outcoupling layer may be composed of a plurality of nanoparticles and in other embodiments the outcoupling layer is composed of a plurality of nanoparticles disposed over a material. In these embodiments the outcoupling may be tunable by at least one of varying a size of the plurality of nanoparticles, varying a shape of the plurality of nanoparticles, changing a material of the plurality of nanoparticles, adjusting a thickness of the material, changing the refractive index of the material or an additional layer disposed on the plurality of nanoparticles, varying a thickness of the enhancement layer, and/or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles wherein the metal is selected from the group consisting of Ag, Al, Au, Ir, Pt, Ni, Cu, W, Ta, Fe, Cr, Mg, Ga, Rh, Ti, Ru, Pd, In, Bi, Ca, alloys or mixtures of these materials, and stacks of these materials. The plurality of nanoparticles may have additional layer disposed over them. In some embodiments, the polarization of the emission can be tuned using the outcoupling layer. Varying the dimensionality and periodicity of the outcoupling layer can select a type of polarization that is preferentially outcoupled to air. In some embodiments the outcoupling layer also acts as an electrode of the device.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the thermal population between the triplet states and the singlet excited states. Compounds that are capable of generating E-type delayed fluorescence are required to have very small singlet-triplet gaps. Thermal energy can activate the transition from the triplet state back to the singlet state. This type of delayed fluorescence is also known as thermally activated delayed fluorescence (TADF). A distinctive feature of TADF is that the delayed component increases as temperature rises due to the increased thermal energy. If the reverse intersystem crossing rate is fast enough to minimize the non-radiative decay from the triplet state, the fraction of back populated singlet excited states can potentially reach 75%. The total singlet fraction can be 100%, far exceeding the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap (ΔES-T). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small ΔES-T. These states may involve CT states. Often, donor-acceptor luminescent materials are constructed by connecting an electron donor moiety such as amino- or carbazole-derivatives and an electron acceptor moiety such as N-containing six-membered aromatic ring.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

As previously disclosed, OVJP processes suitable for fabrication of OLED panels and similar devices involve the dispensation of OLED material in a heated gaseous mixture through print nozzles, commonly defined in Si dies, onto a receptor substrate. The substrate typically is glass, but may be or include metals, plastics, or combinations thereof, or other materials. The substrate may include pre-existing structures such as a passive or active-matrix display backplane. The heated gas mixture is generally obtained by flowing a carrier gas such as H2, He, N2 or Ar, through a sublimation/evaporation source containing the OLED material. OVJP differs from other deposition techniques such as vapor phase deposition, vacuum thermal evaporation (VTE), atomic layer deposition (ALD), and others, and typically deposition systems known for those techniques are not suitable for, and cannot be readily adapted for OVJP techniques and materials. For example, ALD requires at least two separate precursors, each of which forms a self-limiting monolayer on the substrate surface. The precursors are delivered alternately to the substrate, forming one atomic layer on the surface after exposures to pairs of the precursors. In contrast, OVJP is a condensation process where the gaseous organic materials condense on the relatively cooler substrate. As another example, OVJP uses relatively high temperatures for sublimating/evaporating and transporting the organic material to be deposited on a substrate, but uses a relatively cool substrate so as to prevent damage to the organic materials deposited on the substrate. Temperatures for OVJP organic sublimation sources typically range from 200 C to 450 C, which is a much higher range than is used for chemical vapor deposition (CVD) and similar techniques. CVD also uses a substrate temperature significantly higher than the temperature of the source material to cause the required chemical reaction to occur on the substrate surface. OVJP also uses a very small nozzle width in the OVJP depositors and a relatively very small nozzle-to-substrate separation, both of which contribute to the precision deposition profiles achievable through OVJP which typically cannot be achieved with other spray- or nozzle-based deposition techniques. Further, in contrast to blanket layer deposition techniques, OVJP allows for very precise deposition of materials and generally is not used for large-scale blanket depositions. The OVJP process typically uses pressures between 10 Torr and 1 Atm (760 Torr). The material sources may be arranged within the vacuum chamber or externally.

An OVJP system includes one or more OVJP print heads that convey hot gases containing the organic materials to be deposited on the substrate to discrete locations (for example, pixel or sub-pixel regions) on the substrate via one or more nozzles incorporated in the heads. The substrate typically includes preexisting structures such as passive or active-matrix backplane components. OVJP systems typically include a number of OVJP print nozzles, which typically are arranged in a pattern that matches that of the display backplane. In practice, this implies that the nozzle arrangement has the same pitch as the pixels on the resulting display. The nozzles may be provided by, for example, a series of channels through a print die, each of which ends in an aperture from which material is ejected during operation. A "print die" as described herein refers to the component, which includes the deposition and exhaust channels that end in apertures defining the nozzles. The print die typically is fabricated using MEMS processes, though other techniques such as additive manufacturing, laser drilling or ablation, or the like may be used. The nozzles are integrated into assemblies called "print heads," which include gas distribution to the die and manifold from the source, a flight control mechanism that maintains the print dies at a constant gap with respect to the substrate as they move relative to one another and, in some embodiments, component cooling. An OVJP print head may include one or more print dies. The OVJP print head also may include a print manifold to distribute material to the various channels in the print die and ultimately to the nozzles on the bottom (i.e., substrate-facing) side of the print die and the print head. The print manifold typically is a block of material such as metal or silicon to which the print die is attached. The manifold also may connect the print die to the print head assembly. An OVJP print engine typically includes the print die, gas delivery manifold and associated gas lines, the z-positioning or fly height adjustment system and, in some cases, material sublimation sources, such as sources used to generate OLED materials to be deposited on a substrate. Some arrangements disclosed herein use integrated sublimation sources as described in further detail below. Similarly, a "print bar" may include multiple print heads or print engines. During operation, embodiments disclosed herein may allow for independent adjustment of the positioning of individual print bars, print engines, and/or print heads, as described and shown in the various embodiments. Generally, unless not possible based on the specific arrangement, when arrangements disclosed herein refer to arrangement or movement of a print head, the same arrangement may be used with a print engine having additional components in a single controllable unit with the print head. In some embodiments disclosed herein, the positioning of print heads on a common print bar may be controlled as a unit via positioning of the print bar; alternatively or in addition the position of each print head may be controlled independently from the other print heads on the same bar, and/or from other print heads in the system.

In OVJP systems, it generally is desirable for the heated gas and organic material mixture to be hermetically conveyed and distributed from and to system gas lines connected to the organic vapor sources and the exhaust assembly, respectively. Accordingly, the print manifold in each print head may be used to route the gas from inlet to print die and from print die to outlet. It is also desirable to maintain the gas temperature within an appropriate range to prevent condensation (at lower temperatures) or decomposition (at higher temperatures), as well as shielding sensitive system components and the substrate from the heat developed in the print head manifold. Typical delivery and exhaust gas lines used in OVJP and in embodiments disclosed herein operate at temperatures of 250-450 C. The operating temperature range is selected due to the properties of materials commonly used in the different layers of OLED devices, and may vary for the color of emitter being deposited. Preferably, the delivery line and exhaust lines operate at the same temperature or within 0-10 C of each other for any particular materials. The delivery gas used to transport materials for deposition is preferably maintained at the same temperature. A temperature gradient may be imposed between the material source and the print die to prevent condensation, with the ends of the source path varying by about 10-20 C, with the print die being at the higher-temperature end of the gradient.

It is also desirable to maintain the print dies within a vertical distance of the substrate ("fly height") that corresponds to desired process conditions. OVJP fly heights typically are in the range of 20-60 μm. In some arrangements, a closed-loop system using distance sensors and vertical actuators on each print head may be used to maintain a desired fly height above the substrate.

Embodiments disclosed herein provide OVJP systems that include directly-heated delivery lines to provide the gas and organic material mixture to the print die, which can improve efficiency and reduce complexity of the system, while still maintaining an acceptable throughput, deposition quality and consistency, and convenience.

Figure 3:
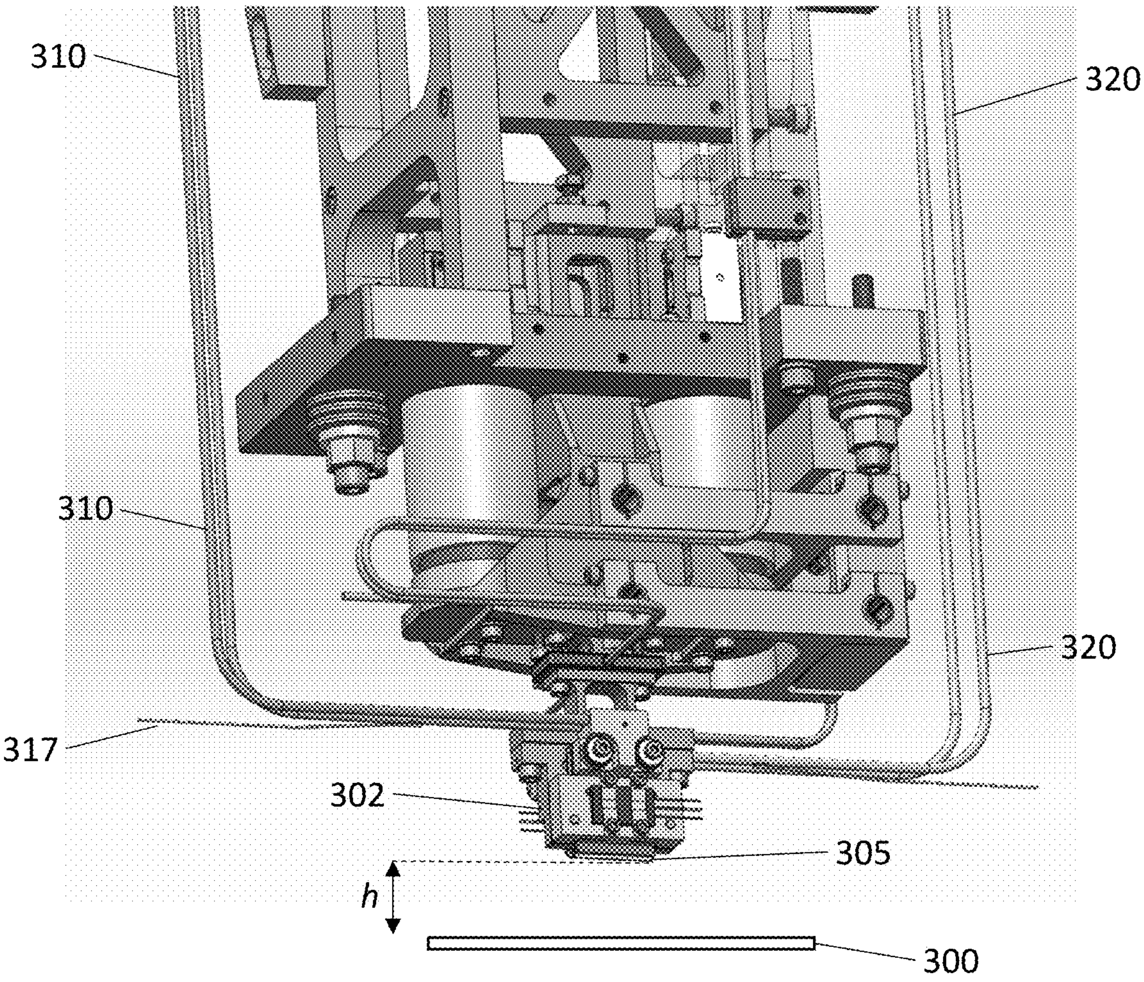
FIG. 3 shows an example OVJP system as disclosed herein.

FIG. 3 shows an example OVJP system as disclosed herein. The system includes a print die 305 that ejects a carrier gas transporting the organic material to be deposited on a substrate 300 toward the substrate 300. As used herein, the substrate may be described as being arranged "below" an OVJP print die or print head if the substrate is disposed in the path of the jet of material ejected from the OVJP print die, regardless of their orientation with respect to one another relative to the direction of gravity. That is, the print die may eject material in an upward direction and the substrate may be disposed "above" the print heads relative to the direction of gravity. In such an arrangement the substrate is still considered to be disposed "below" the OVJP print die as described herein.

One or more delivery lines 310 provide the flow of carrier gas in which organic materials to be deposited on the substrate 300 are entrained. The delivery lines provide the organic material flow from one or more material sources to the OVJP print die 305, typically through a print manifold 302. Delivery lines 310 may be directly heated. As used herein, a line that is directly heated or a "directly-heated" component is one that is configured to generate heat itself in some fashion, rather than being heated through use of separate attached heaters or heaters placed in close proximity as is used in some conventional OVJP systems. For example, as disclosed herein, a "directly-heated" line include arrangements in which the line includes resistive material that generates heat when an electrical current is applied to the material, thereby causing the line itself to generate heat.

Figure 4A:
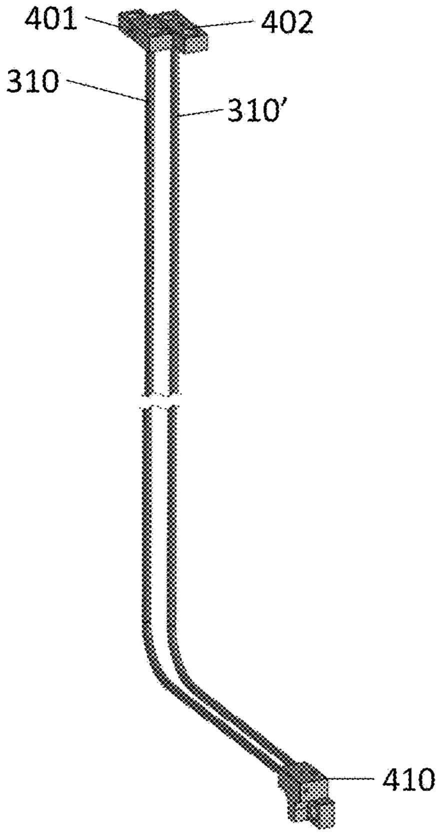
FIG. 4A shows an example of a directly-heated delivery line as disclosed herein.
Figure 4B:
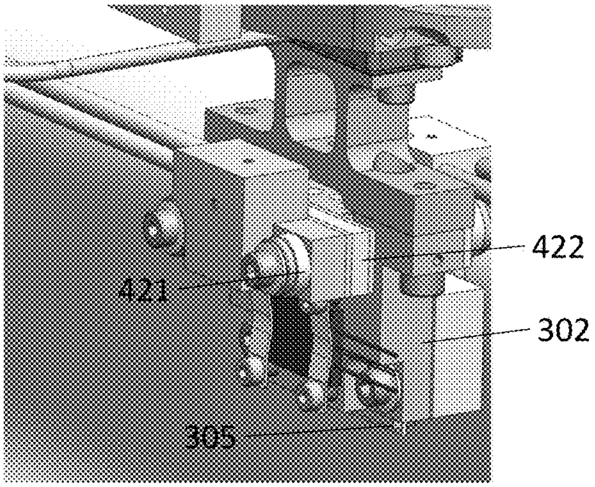
FIG. 4B shows an enlarged view of the print manifold shown in FIG. 4A, the print head, and the near end of the delivery line.

FIG. 4A shows an example of a directly-heated delivery line according to embodiments disclosed herein. FIG. 4B shows an enlarged view of the print manifold, print head, and near end of the delivery line 310. The delivery line 310 may be formed from a resistive material as disclosed herein and connected to electrical connections 401, 402 to form an electrical circuit that includes the resistive material of the delivery line 310. When a current is applied to the resistive material of the delivery line, it raises the temperature of the resistive material and thereby heats both the material and the interior of the delivery line. An electrical return 310' may be used to complete the circuit. The delivery line 310 may be made entirely or substantially entirely (i.e., with only minimal or de minimis amounts of other material that do not appreciably affect the electrical and/or heating properties of the line) of the resistive material.

As shown in FIG. 4B, the delivery line 310 and any return line 310' may be electrically insulated from the print manifold 302 and/or the print die 305, for example by ceramic insulators 421, 422 or other connectors that provide a hermetic seal between the end of the delivery line 310/310' and the manifold 302. In this arrangement, the delivery line 310 becomes a heating element itself. Temperature sensors such as thermocouples, RTDs, or the like, may be attached to the delivery line 310 for closed-loop temperature control, such as via a control line 317 as shown in FIG. 3. The control line 317 may be connected to a processor to allow for closed-loop control of the delivery line temperature based upon signals received from the temperature sensors. For example, signals from the temperature sensor may be provided to the processor, which in turn sends control signals directly or via other control components to the delivery and/or exhaust lines to adjust the temperature of those lines, such as by increasing or decreasing the electrical current applied to the resistive material of the line.

In some configurations, the exhaust line 320 may be a directly-heated line as well. The same materials, configurations, and connections may be used as described with respect to the delivery line 310. Specifically, the exhaust line 320 may be directly heated by applying an electrical current to a resistive material that forms the exhaust line 320, so as to heat the line and the interior of the line in the same manner described above with respect to the delivery line 310.

Figure 4C:
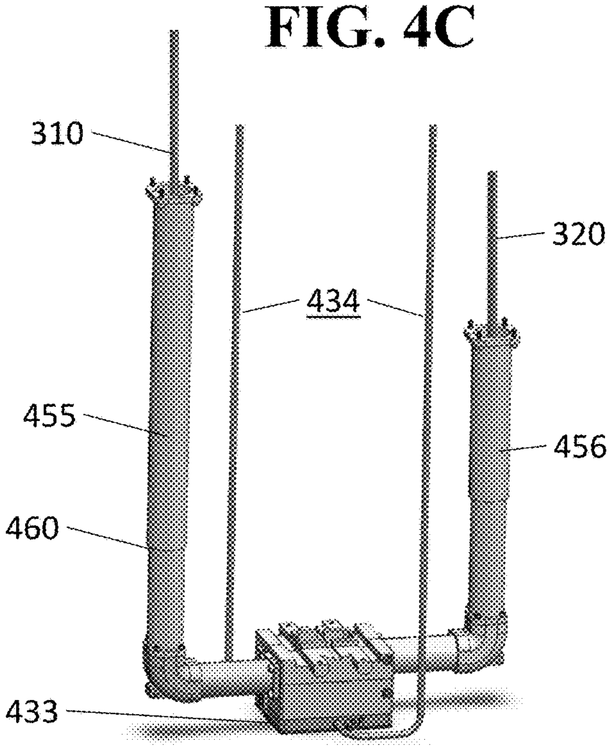
FIG. 4C shows an example of the delivery line, exhaust line, and print head including various insulation structures as disclosed herein.
Figure 4D:
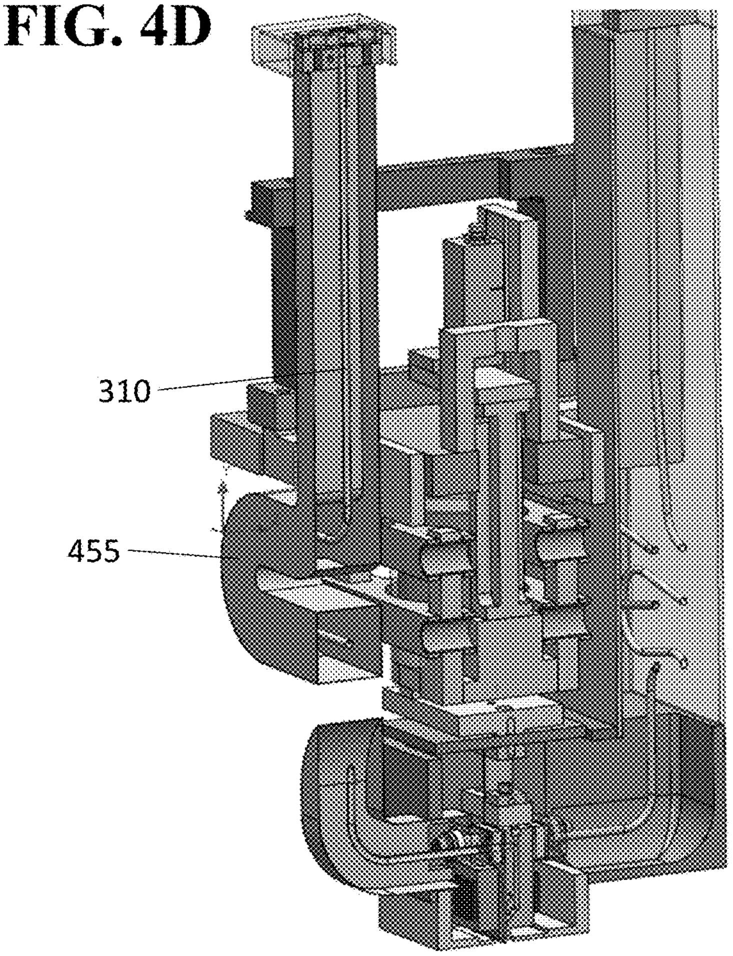
FIG. 4D shows an example of a heat shield in the form of a duct disposed around a delivery line as disclosed herein.

FIG. 4C shows an example of the delivery line, exhaust line, and print head including various insulation structures. To maintain a desired temperature of the delivery line 310 and exhaust line 320 and to prevent heat generated by these components, they may be surrounded by heat shields 455, 456, respectively, as shown. The heat shields 455, 456 may be an outer duct with uniform cross-section shape and area. Because the heat generation in a constant cross-section tube such as the delivery and exhaust lines 310, 320 is inherently uniform, the heat losses along the tube length should also be uniform for the sake of temperature uniformity of the gas path. To achieve this, it may be desirable to ensure the environmental gases' laminar flow along the tubing, which in turn provides low and constant convection losses from the heated tube element. One way to achieve this goal is the use of a constant cross-section duct 455, 456 as shown in FIG. 4C, which matches and follows the shape of the delivery or exhaust line 310, 320. The shape of the cross-section of this duct may be adjusted as needed to facilitate the temperature uniformity, or a desired gradient along the gas path. The outer duct may be circular as shown in FIG. 4C or rectangular as shown in FIG. 4D. The constant cross-section shields may, or may not be forced-cooled, as needed for maintaining the temperature uniformity, as well as keeping the temperature of other critical elements of the print engine below desired levels as described in further detail below. Where non-cooled shields are used, it may be preferably that they be constructed from thin-walled materials with high thermal conductivity and low emissivity for improved infrared heat reflection.

A slip joint 460 or other structure in the heat shield 455, 456 may be used to allow sufficient clearance to accommodate displacements due to thermal expansion and/or vertical movement of the print head during operation. FIG. 4D shows another example of a heat shield 455 having the form of a duct disposed around the delivery line 310, where the delivery line 310 is arranged in an S-shape as described in further detail below. As previously disclosed, similar structures may be used around the exhaust line 320 and/or other gas transport lines in the system. Also shown in FIG. 4C is a cold plate or other active cooling device 433, which may be used to reduce heat transfer between the print die/manifold structure and the substrate. For example, the active cooling device 433 may be a water cooler with feed and return lines 434 providing circulation of water or similar coolant through the device. The use of an active cooling device 433 may reduce or prevent damage to materials already deposited on the substrate during operation of the OVJP system.

Figure 4E:
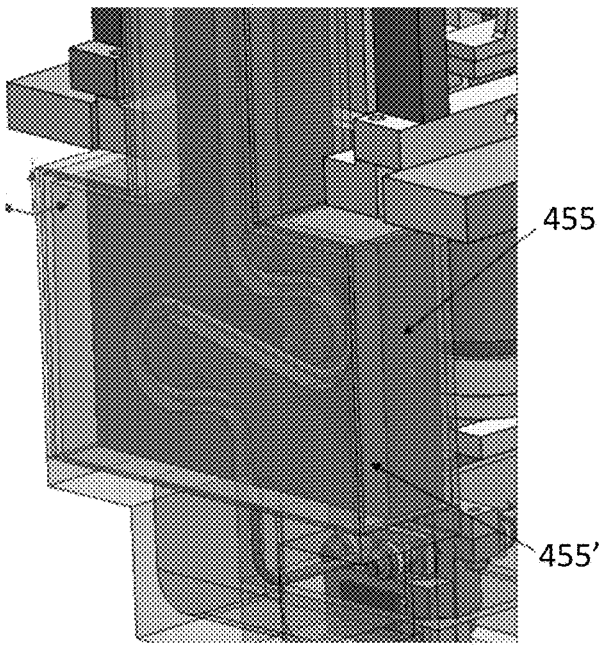
FIG. 4E shows an example of a heat shield in the form of an insulating enclosure as disclosed herein.

Alternatively, the heat shield 455/456 may take the form of an insulating enclosure, as shown in FIG. 4E, which also shows an arrangement in which the delivery line 310 is in an S-shape. The enclosure 455 may be, for example, a container with a sealable lid 455', for example a ceramic enclosure.

Regardless of specific form, the heat shield 455, 456 may have sufficient clearance to allow for movement between a maximum and minimum horizontal displacement during operation of the OVJP system. The heat shield 455, 456 also may include structures, such as the slip joint 460 previously described with respect to FIG. 4C, to allow for thermal expansion and contraction and/or vertical movement of the OVJP print head relative to an external source, where the source is not integral with the print head.

Rather than using directly-heated lines, an indirect heating source may be used to heat the delivery line 310 and/or the exhaust line 320. In such a configuration, the sections of the associated tubing are surrounded by a heated enclosure, i.e., a small oven. The enclosure may be made of material with high thermal conductivity (such as Copper, Molybdenum, or the like) for improved thermal uniformity. A multitude of discrete heater elements are attached to the body of this enclosure in strategic places. Temperature control is facilitated either by sensors embedded within the heater elements, or, alternatively, attached to the corresponding locations on the gas-conducting tubing. When Copper or similar materials are used, the surface of the tubing may be coated with Ni or a similar material to decrease emissivity and reduce energy losses through radiation.

Regardless of the particular arrangement used to heat the gas passages and the print die, other elements of the print head (such as voice coil actuators, flight height sensors, etc.), as well as the substrate, may need to be protected from excessive heat. One or more water-cooled shields or other active cooling components may be used to provide such cooling. The shields form a second-layer enclosure, or a multitude of enclosures as appropriate, around heated parts of the print head, for example as shown at 433 in FIG. 4C.

Furthermore, the print manifold may be mounted to a mounting plate by flexures. An upper heat shield may help maintain the mounting plate at room temperature as the manifold is heated to operating temperature. Distortion of the manifold caused by print head heating is managed by constraining the manifold in the vertical direction only, while leaving it free to expand laterally and, using flexures of the correct stiffness (determined by FEA analysis), by limiting the stresses due to length change caused by the change in manifold temperature.

Flexures of equal stiffness positioned equidistantly from the (lengthwise) center of the mount plate may be used so that the midpoint of the manifold with respect to the mount plate (the thermal center) does not change as the temperature of the manifold increases, i.e., the deformation is symmetric about the thermal center. The flexures may further ensure that the forces on the manifold block are kept to minimum, which in turn minimizes out-of-plane deformations.

Preferred materials for the flexures have low thermal expansion and should be compatible with OVJP process temperatures. For example, grade 5 Ti or some stainless steel alloys may be used.

The heat shields themselves may be made from a metal with high thermal conductivity, such as Copper, or Molybdenum. Micro-channels inside the material may be hermetically sealed by a suitable method, such as brazing, soldering, diffusion bonding, or the like. The surfaces of the shields may be plated by chemically inert metals with low emissivity. Where water cooling is used, the water may be pushed through the channels of the heat shields by a pressure differential. The temperature of the incoming water may be controlled by an external chiller, while the temperature of the outgoing water is monitored and adjusted by adjusting the pressure differential as needed.

Returning to FIG. 3, the print manifold 302 provides an interface between the organic gas delivery line(s) 310 and exhaust line(s) 320 and the print nozzles incorporated in the print die 305. Typically the OVJP print die 305 includes a series of vias, organized in at least 2 groups corresponding to organic gas supply and exhaust, connected to the print nozzles. Typical print die sizes range from 30 to 100 mm, though nozzles only occupy a portion of this length. For example, the apertures that make up the nozzles in the print die 305 may occupy a central portion extending across 76 mm of a 100 mm print die. The manifold 302 may be formed from multiple layers and includes channel structures to distribute the organic gases evenly to the delivery vias and from the exhaust vias, that the gas flows to and from the die meet the requirements for the targeted print process, and that there are no "dead zones" where gas can be trapped, leading to unintended condensation. Delivery and exhaust channels may be defined on the same side or on opposite sides of the die depending on the die design. Examples of suitable print die arrangements, fabrication techniques, and the like, are provided in U.S. Pat. Nos. 9,583,707, 10,704,144, 11,104,988, 11,220,737, 11,267,012, and 11,588,140, the contents of each of which is incorporated by reference in its entirety, and U.S. Patent Publication No. 2021/0280785, the contents of which is incorporated by reference in its entirety. Illustrative examples of print die arrangements that may be particularly suited for use with the embodiments disclosed herein are described in and shown in FIG. 4 and associated text in U.S. Pat. No. 11,267,012, and FIGS. 5-6 and associated text in U.S. Pat. No. 10,704,144, though other arrangements may be used. For example, FIG. 4 of U.S. Pat. No. 11,267,012 shows a cross sectional view of a nozzle assembly 400 having delivery channel adjacent to, or surrounded by, one or more exhaust channels 402. Delivery gas transporting material to be deposited is ejected from an aperture of the delivery channel 401. Material 305 that does not deposit on the substrate is removed through the exhaust channel 402. A confinement gas 403 may be provided in a direction opposing the flow of material ejected from the aperture of the delivery channel of the nozzle from a source, such as a nozzle, an ambient source, or the like, from a location below the nozzle and adjacent to the nozzle and/or the exhaust channel 402. The confinement gas may flow inward from the outside of the deposition zone and guide surplus material into the exhaust channels 402. The exhaust channel 402 typically is connected to a vacuum source. The exhaust channel 402 may be angled relative to the delivery channel 401 to improve the uniformity of the deposited material on the substrate, in the defined areas where material is deposited. The exhaust channel 402 may partially or fully surround the the delivery channel 401. In some configurations, the nozzle aperture may be defined by the planar edge of the nozzle block and a channel within the nozzle block, such that an additional tapered or extended physical portion beyond a lower surface of the nozzle block is not required. The nozzle aperture can be bifurcated or otherwise divided, for example by a delivery channel separator 404. As another example, FIGS. 5-6 of U.S. Pat. No. 10,704,144 show views of a "DEC" type print die ("nozzle block") that uses one or more shield gas flows around micronozzle arrays. Ambient gas in the OVJP deposition chamber typically is relatively stagnant. A flowing shield gas may use purified so that water and 02 levels in the deposition chamber are less than 0.001 ppm. In this arrangement, shield gas channels 501 mounted in front of and/or behind the depositing nozzle generate a purified gas flow that isolates the nozzle arrays from residual gasses that may be present in the chamber. Shield gas channels 502 that are mounted between nozzle arrays provide a source for the confinement gas to achieve accurate patterning and prevent vapors from adjacent arrays from bleeding together. FIG. 6 of U.S. Pat. No. 10,704,144 shows a view of the print die from the substrate-normal direction in FIG. 6. The depositor contains a single aperture or multiple apertures at the terminus of channels inside a monolithic nozzle block. The delivery aperture 603 delivers a mixture of one or more organic vapors entrained within an inert delivery gas. The exhaust aperture 604 is in communication with exhaust channels that withdraw gas from the region between the depositor and substrate. Optional confinement channels 605 are formed by depressions in the depositor face. These channels provide low resistance paths for confinement gas to flow from the edge of the nozzle block towards the midline of the depositor where it is needed to block the spread of organic vapor. Confinement flow in this arrangement is supplied by the gas ambient surrounding the depositor, which is from the shield gas flow as opposed to the chamber ambient. Alternatively, a confinement gas may be supplied via one or more confinement apertures 606.

The manifold should be made of materials that can survive the temperatures used in OVJP, preferably materials that are resistant to temperatures of 500 C or more to be compatible with a wide range of OLED materials. The manifold materials should also be good thermal conductors. The manifold often incorporates heaters for maintaining the organic materials in the transport gas at a temperature sufficient to prevent condensation but not so high as to damage the organic materials. The materials should also have a relatively low coefficient of thermal expansion, preferably matching or being close to that of the print die material. The material should also be susceptible to fabrication of the delivery, exhaust, and any other channels, for example via micromachining, photolithographic techniques, 3D printing, or other methods.

Based on these requirements and because OVJP print dies often are made from Si, appropriate materials for the manifold include metals such as W and Mo, ceramics such as AlN and single crystal or polycrystalline/columnar Si.

The print die is assembled with the print manifold in hermetic fashion, i.e., to minimize the amount of gas that can escape through the interface between the two. This in turn minimizes the risk of uncontrolled deposition on the substrate as well as particle generation caused by condensation at the leak location. As previously disclosed, the material stream used in OVJP deposition processes includes organic material sublimated into a stream of carrier gas. The carrier gas typically is a low molecular weight compound such as H or He, so it is convenient to express the hermeticity requirement in terms of a He leak rate. Preferably, the leak rate of the print manifold/die assembly is on the order of $1\times10^{-7}$ Torr L/s, preferably maintained over the entire OVJP operating temperature range up to 500 C and for durations conducive to uninterrupted system operation, which may be on the order of several months.

Suitable techniques to join the manifold and print die include mechanical clamping with uniform force application, for example via appropriately distributed and preloaded bolts, using disk springs to apply a preload as the print head is temperature cycled, and sealing, for example using c-rings, Au wire, or the like. Bolts and springs used in the attachment should be compatible with the OVJP process temperature, so materials such as Nitronic 60 and 718 Nickel may be used. Other bonding techniques may be used, such as high temperature soldering (e.g., AuIn), brazing (e.g., InCuAg), diffusion bonding (e.g., Ag), glass frit bonding (using paste, preforms or tape) or fusion bonding (for Si manifolds/dies).

It is also beneficial to minimize stresses and deformations in the assembly since these can lead to leakage and reliability issues, especially for the bonding approaches, which involve temperatures well in excess of the maximum process temperature. Introducing some compliance in the bonding film, for example by using a thick ductile film such as Ag, may help alleviate such issues. Preventing Silicide formation, which can weaken the die interface, can be achieved using barrier layers (e.g., Ni).

Just as the manifold connects the supply and exhaust gases to the nozzles of the die, the manifold is connected to the system-level gas distribution infrastructure. This connection may be direct or involve intermediate manifolds (e.g., at the print head level for a multi-die print head, or at the print bar level, which refers to a sub-system consisting of multiple print heads installed on a common mount). Since each print head may be independently movable in vertical direction for both flight control and start-stop of the printing (lift-off and landing), the gas connection method should facilitate hermetic, but geometrically flexible interface. In addition, this interface should keep the delivery and exhaust gases at desired elevated temperatures.

Arrangements commonly known in the OVJP art for providing the desired flexibility, such as bellows, may exhibit undesired characteristics of significantly increased cross-section and possible gas-stagnation regions. These characteristics are likely to promote condensation and accumulation of organic deposition chemistry. To mitigate these effects, it may be preferred to maintain the delivery and exhaust lines at a constant cross-section as previously disclosed, where the cross-section area is selected to be only as large as necessary for the required conductance. Various flexible tubing elements can be used to achieve these desired effects. Both ends of the flexible elements should terminate in flanges, used to seal the gas connection to the manifolds of the print head, and to the print bar respectively. To accommodate elevated temperatures, various types of metal seals can be used. One of them could be a soft metal (such as gold) wire ring, another could be C-seal, made of stainless steel, or super alloys.

Figure 5:
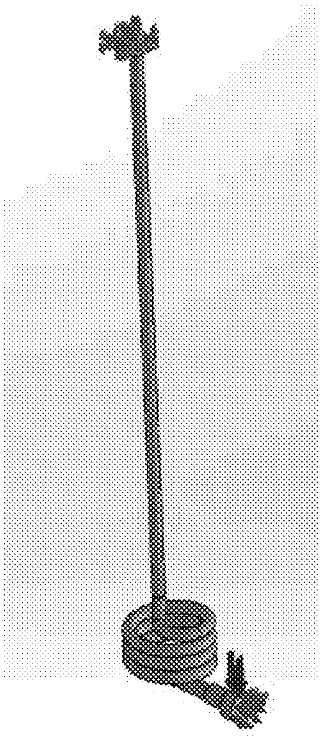
FIG. 5 shows an example of a three-dimensional spiral section of tubing in a delivery line as disclosed herein.
Figure 6:
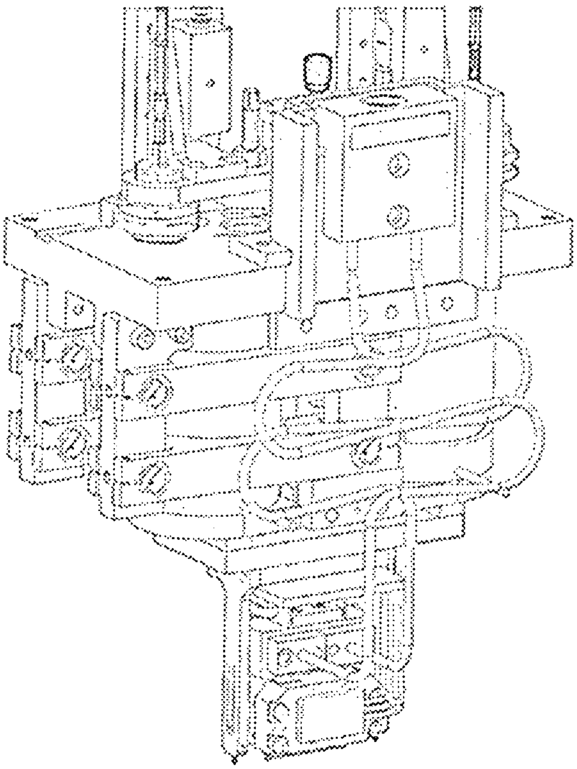
FIG. 6 shows an example of S-shaped delivery lines and an arrangement with multiple delivery lines as disclosed herein.

One suitable arrangement is the use of a three-dimensional spiral section of tubing in the delivery line, for example as shown in FIG. 5. Another variation is an S-like shape formed by a constant cross-section tubing as shown in FIG. 4D, 4E, and FIG. 6. Another variation is to use an L-shaped bend portion in the tubing with enough length in the horizontal leg to provide the desired compliance, for example as shown in FIGS. 4A and 4C.

To keep the tubing as flexible as possible, it may be preferred to use the smallest conductance-defined cross-section of the tubing with the thinnest wall. Because exhaust side conductance should accommodate higher flow than the delivery side, a multitude of tubes may be used, such as shown in FIG. 6.

The process gases flowing through the print head towards the nozzle, as well as exhaust gases while being evacuated through the print head, should be maintained at elevated process temperatures. The process window is relatively narrow: too high a temperature results in decomposition of the organics, while too low temperature results in condensation of the precursors on the walls of the gas passage. Since the process flow rates are rather small, the thermal capacity of the process gases, even that of the exhaust gases, is not sufficient to maintain the required temperature of the passages. For this reason, it is preferred to heat the gas conduits using an external energy source or directly-heated arrangements as previously disclosed. Furthermore, the temperature of the organic gas must be kept within a well-defined temperature range as it passes through the print die itself. On the one hand, condensation must be avoided; this is done by ensuring that gas experiences a relatively small temperature gradient as it is transported to the print nozzles. On the other hand, too high a temperature can result in dissociation of the organic materials. It therefore may be desirable for the print head to incorporate a controllable heating capability. For example, referring to FIG. 3 again, heating elements may be clamped or otherwise bonded to both sides of the manifold 302 and over its entire width and height, thereby providing for sufficient and uniform thermal contact. As another example, heater traces may be embedded directly in the manifold, as can be done with ceramic materials such as AlN, Al2O3, and Si3N4. W traces may be screen printed between the various layers making up the manifold structures and sintered during the AlN firing process. Heater traces also may be patterned directly onto the manifold, for example via screen printing or photolithographic techniques. Such an arrangement may be particularly applicable to Si-based manifolds.

Thermal simulations may be used to verify that the heater configuration/trace layout keeps the gas in the right temperature range as it passes through the print head. To achieve this, the heaters may need to be segmented into multiple zones which may either be independently controlled or have a static relationship to one another. For real-time, closed loop control, temperature sensors such as thermocouples or resistance temperature detectors (RTDs) may be incorporated in the print heads. In the case of AlN manifolds, W RTDs may be embedded in similar fashion to the heater traces. RTD traces also may be patterned on Si manifold in the same way as heater traces.

Referring again to FIG. 3, the print head fly height h, i.e., the gap between the print die and the substrate (across the entire die), is a critical parameter in determining the thickness and uniformity of the printed lines. An OVJP print head as disclosed herein may incorporate a flight control mechanism to maintain this gap at the desired value as the substrate scans below it. In general, the flight control mechanisms may include actuation element and a gap sensor element on either side of the print die. These may operate in a closed loop with one another: the sensor measures the fly height, and the actuator adjusts the height to bring the fly height to the target value. Closed loop control of the fly height may be achieved by means of various algorithms, such as Proportion-Integral-Derivative or Limit-based control, residing on and executed by a PLC, motion controller, or other suitable processor. Such algorithms may control the position of the voice coils in real time based on the (change in the) reading of the fly height sensors via servo-drives connected to the PLC/motion controller.

Typical operating ranges for the flight control mechanism in an OVJP system are:

- Fly height range: 20-60 um
- Fly height sensing resolution: <100 nm
- Flight control error: +/−0.5 um (to avoid visible non uniformities in display quality)
- Control bandwidth ~10 Hz (to follow glass profile variations)
- No sensitivity to substrate surface properties (reflectivity, conductivity)

The flight control mechanism should also be able to lift the print heads to and from the so-called lift-off gap, which is the fly height at which no deposition takes place. In OVJP, the lift-off gap typically is about 200 μm. The landing and lifting should occur with a narrow strip at the leading and trailing edges of each panel row while the substrate is moving, typically leaving less than about 5 ms for motion.

Vertical actuators suitable for use with OVJP systems disclosed herein include voice coils, piezo motors, linear motors, and pneumatic actuators, and the like. A pair of actuators may be connected to a parallel arm linkage, forming a vertical motion mechanism. The pivots of each linkage are self-contained flexure type bearings utilizing internal flat crossed springs inside of a cylinder. The two actuators are positioned side-by-side, allowing for a tilting action of the print head about the centerline. The bearings of the motion mechanism are flexure based and hence they have a spring rate which allows for some movement in radial and axial direction. This compliance allows for a minimal amount of rotation of the print head by varying the force of each voice coil. An adjustable spring counterbalance may be used to counteract the vertical force from gravity, which allows the size of the actuators to be minimized because they only need account for forced due to acceleration. The print head module may be mounted with three adjusters to the mounting plate allowing for installation and leveling.

Fly height sensors suitable for use with OVJP systems disclosed herein include optical sensors such as spectral interference, chromatic confocal and triangulation sensors, electrical sensors such as capacitive and eddy current sensors (though these may be overly sensitive to surface conductivity) and pressure sensors. In addition, absolute linear encoders connected to the moving portion of the voice coil can serve as reference and tracking sensors for the position of the print. They also may provide redundancy for the fly height sensors and, because of their generally larger range, they can be used to control large vertical moves such as the lift off required to stop deposition.

The print head may be mounted to the bottom of the voice coil moving plate as a unit. In this arrangement, swapping the head requires only 4 bolts and unhooking the gas lines from the head, which allows different head designs to be interchangeable.

An important aspect of accurate gap sensing is the calibration of the fly height sensors. Several approaches are possible to accomplish this, including touch and no-touch methods.

Touch methods involve resting the edges of the print die onto ultra-flat reference surfaces (such as gage blocks). Thus the "active area" of the die, in which the nozzles are defined, is not in contact with the blocks. The reference surfaces may be made co-planar by mounting them on a flat base such as a granite slab. Calibrated shims or other similar structures may be used to position the fly height sensor to the right distance of the reference surfaces, after which the distance from the sensors to the reference surfaces, i.e., the vertical offset between the sensors and the die, may be measured on both sides using the fly height sensors themselves to achieve sensor calibration. Using reference surfaces made from low thermal conductivity and low thermal expansion material (e.g., quartz, ceramic) allows the calibration to be performed at the print heads operational temperature without damaging the fly height sensors (assuming heat shields are in place). No-touch methods may use a separate sensor, such as a laser distance (triangulation) sensor, moving along the length of the die on a stage with low flatness (vertical position error). This sensor can be used to measure the vertical offset between the FH sensors and the corresponding die edge without requiring contact to the die. This configuration also allows for calibration of hot print heads.

A default OVJP print head configuration may include a single die and a pair of fly height sensors and vertical actuators as previously disclosed. For systems capable of processing relatively large glass substrates, such an arrangement may lead to significant system cost and complexity. For example, a 55" panel layout on a Gen 8.5 substrate would require 32 single die print heads (with 64 fly height sensors and 64 vertical actuators) for each printed material. In general, OLED TV fabrication will require printing of different emissive layers for each color (Red, Green, and Blue), so this would involve a total of 96 print heads and 192 sensors/actuators.

One way of simplifying system controls complexity and costs is to use common fly height controls for multiple print dies. For instance, a print head combing 4 dies may make sense for the 55" Gen 8.5 layout discussed above; this would involve 24 print heads with 48 fly height sensors and vertical actuators (the size of the latter needing to increase relative to the single die print head to match the mass increase). Such a configuration no longer offers individual control over the fly height and tilt of each die, and it is therefore of critical importance to ensure that the dies in such a print head are accurately aligned to one another in the vertical direction (in addition, the glass flatness will need to be controlled over a larger distance). The maximum allowed vertical alignment error between dies in a multi-die print head is +/−0.35 um.

In theory, this level of accuracy may be achieved by justifying the dies to an ultra-flat reference surface. However, in practice it often is preferable to avoid contacting the face of the die in which the nozzles are defined to prevent contamination and damage. This may be achieved by measuring the vertical distance between the die (edges) and a flat reference surface and adjusting this distance until all die edges are within the error margin. One way of measuring the distance between the die edge and a flat reference surface is by using an approach similar to non-contact sensor calibration, i.e., using a laser distance sensor that can move along the length of the print die on a stage with ultra-low flatness, itself mounted on an ultra-flat surface (e.g., granite). The error in the distance measurement must be significantly smaller than the allowed vertical alignment error between the dies, for example, 0.1 μm or less. In addition, achieving the level of stage flatness compatible with the allowed die alignment error may be achieved by implementing active compensation based on flatness metrology. This requires precision motion of the laser distance sensor in the vertical direction, which can be achieved with for instance piezo drives or linear motors.

Adjustment of the position and tilt of the individual dies in a multi-die print head should be based on the measured distance values. The adjustability calls for a resolution that is also significantly smaller than the allowed vertical alignment error between the dies (e.g., 0.1 μm or less). Suitable options for use with OVJP systems disclosed herein include lockable ultra-fine pitch adjustment screws (for manual adjustment) or automatic adjustment using for instance piezo drives or linear motors. The latter increases system complexity but would allow for closed loop alignment using the input from the laser distance sensors, resulting in a faster, less resource insensitive procedure. A multi-die print head used in systems disclosed herein may still involve separate manifolds for each die, especially in configurations where a common manifold would be much more difficult to fabricate.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. An organic vapor jet printing (OVJP) device comprising:

an OVJP print die comprising one or more delivery channels to deliver organic material and carrier gas to a region below the OVJP print die;

a directly-heated delivery line connected to the one or more delivery channels and configured to connect to a source of the organic material that is external to the OVJP print die, the directly-heat delivery line comprising:

a resistive material; and a plurality of electrical connections that connect to the resistive material;

wherein, when a current is applied to the resistive material via the plurality of electrical connections, the resistive material heats the interior of the directly-heated delivery line.

2. The OVJP device of claim 1, wherein the directly-heated delivery line has a constant cross-section shape and area.

3. The OVJP device of claim 1, wherein the directly-heated delivery line is formed entirely or substantially entirely of the resistive material.

4. The OVJP device of claim 1, wherein an end of the directly-heated delivery line connected to the OVJP print die is electrically insulated from the OVJP print die.

5. The OVJP device of claim 1, wherein the directly-heated delivery line forms a spiral, an S-shape, or an L-shape.

6. The OVJP device of claim 1, further comprising:

one or more temperature sensors; and a processor in signal communication with the one or more temperature sensors and configured to perform closed-loop control of a temperature within the directly-heated delivery line based upon a temperature signal provided by the one or more temperature sensors.

7. The OVJP device of claim 1, further comprising a heat shield disposed around the directly-heated delivery line.

8. The OVJP device of claim 7, wherein the heat shield comprises a ceramic enclosure with sufficient clearance to allow for movement of the directly-heated delivery line when the OVJP device is moved between a maximum horizontal displacement and a minimum horizontal displacement.

9. The OVJP device of claim 7, wherein the heat shield comprises a duct disposed around the directly-heated delivery line, the duct having a constant cross-section shape and area.

10. The OVJP device of claim 9, further comprising an active cooling device arranged and configured to cool at least a portion of the duct.

11. The OVJP device of claim 1, further comprising:

a directly-heated exhaust line connected to one or more exhaust channels in the print die to remove material from below the print die and configured to connect to an external source of vacuum, the directly-heat exhaust line comprising:

a resistive material; and a plurality of electrical connections to the resistive material;

wherein, when a current is applied to the resistive material of the directly-heated exhaust line via the plurality of electrical connections of the directly-heated exhaust line, the resistive material of the directly-heated exhaust line heats the interior of the directly-heated exhaust line.

12. The OVJP device of claim 11, wherein the directly-heated exhaust line is disposed within a heat shield duct having a constant cross-section shape and area.

13. The OVJP device of claim 12, further comprising an active cooling device arranged and configured to cool at least a portion of the duct.

14. The OVJP device of claim 1, further comprising a manifold configured to distribute material from the directly-heated delivery line to the one or more delivery channels.

15. The OVJP device of claim 14, wherein the manifold comprises one or more materials selected from a group consisting of: AlN, $Al_2O_3$, and $Si_3N_4$.

16. The OVJP device of claim 15, further comprising:

one or more temperature sensors attached to the manifold; and a processor in signal communication with the one or more temperature sensors and configured to perform closed-loop control of a temperature within the manifold.

17. The OVJP device of claim 16, wherein the processor is further configured to perform closed-loop control of a temperature within the directly-heated delivery line.

18. The OVJP device of claim 14, wherein the manifold comprises W, Mo, AlN, single-crystal Si, polycrystalline Si, columnar Si, or a combination thereof.

* * * * *